(12) United States Patent
Lauer et al.

(10) Patent No.: US 9,136,671 B2
(45) Date of Patent: Sep. 15, 2015

(54) EDGE EMITTING SEMICONDUCTOR LASER

(75) Inventors: Christian Lauer, Regensburg (DE); Alvaro Gomez-Iglesias, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 229 days.

(21) Appl. No.: 13/503,661

(22) PCT Filed: Aug. 25, 2010

(86) PCT No.: PCT/EP2010/062416
§ 371 (c)(1),
(2), (4) Date: Jun. 14, 2012

(87) PCT Pub. No.: WO2011/051013
PCT Pub. Date: May 5, 2011

(65) Prior Publication Data
US 2012/0250717 A1 Oct. 4, 2012

(30) Foreign Application Priority Data

Oct. 30, 2009 (DE) .......................... 10 2009 051 348
Nov. 30, 2009 (DE) .......................... 10 2009 056 387

(51) Int. Cl.
*H01S 5/00* (2006.01)
*H01S 5/10* (2006.01)
(Continued)

(52) U.S. Cl.
CPC .................. *H01S 5/10* (2013.01); *H01S 5/1082* (2013.01); *H01S 5/0425* (2013.01); *H01S 5/0655* (2013.01);
(Continued)

(58) Field of Classification Search
CPC ... H01S 5/0655; H01S 5/068; H01S 5/06825; H01S 5/028; H01S 5/0282; H01S 5/10; H01S 5/1003; H01S 5/1017; H01S 5/2081–5/209
See application file for complete search history.

(56) References Cited

U.S. PATENT DOCUMENTS 6,148,013 A * 11/2000 Geels et al. ................. 372/46.01
6,414,976 B1 * 7/2002 Hirata ....................... 372/45.013
(Continued)

FOREIGN PATENT DOCUMENTS

DE 10 2008 013896 A1 6/2009
DE 10 2008 025922 A1 12/2009
(Continued)

OTHER PUBLICATIONS

C. Lindsey et al., "Tailored-Gain Broad-Area Semiconductor Laser With Single-Lobed Diffraction-Limited Far-Field Pattern," Electronics Letters, vol. 21, No. 16, Aug. 1, 1985, pp. 671-673.
(Continued)

*Primary Examiner* — Jessica Stultz
*Assistant Examiner* — Sean Hagan
(74) *Attorney, Agent, or Firm* — DLA Piper LLP (US)

(57) ABSTRACT

An edge emitting semiconductor laser includes a semiconductor body including a waveguide region, wherein the waveguide region includes a first waveguide layer, a second waveguide layer and an active layer arranged between the first and second waveguide layers and generates laser radiation, the waveguide region is arranged between first and second cladding layers disposed downstream of the waveguide region in a growth direction of the semiconductor body, a phase structure is formed in the semiconductor body and includes at least one cutout extending from a top side of the semiconductor body into the second cladding layer, at least one first intermediate layer including a semiconductor material different from the semiconductor material of the second cladding layer is embedded into the second cladding layer, and the cutout extends from a top side of the semiconductor body at least partly into the first intermediate layer.

15 Claims, 5 Drawing Sheets

(51) Int. Cl.
  *H01S 5/042* (2006.01)
  *H01S 5/065* (2006.01)
  *H01S 5/20* (2006.01)
  *H01S 5/32* (2006.01)
  *H01S 5/40* (2006.01)

(52) U.S. Cl.
  CPC ............ *H01S 5/2004* (2013.01); *H01S 5/209* (2013.01); *H01S 5/2036* (2013.01); *H01S 5/2081* (2013.01); *H01S 5/2086* (2013.01); *H01S 5/3211* (2013.01); *H01S 5/3213* (2013.01); *H01S 5/4031* (2013.01); *H01S 2301/166* (2013.01); *H01S 2301/176* (2013.01); *H01S 2301/18* (2013.01)

(56) References Cited

U.S. PATENT DOCUMENTS

| | | |
|---|---|---|
| 6,920,160 B2 * | 7/2005 | Zeitner et al. ............ 372/29.023 |
| 6,947,464 B2 | 9/2005 | Schmid |
| 8,270,451 B2 * | 9/2012 | Schmid et al. ................ 372/108 |
| 2003/0219053 A1 | 11/2003 | Swint et al. |
| 2004/0191941 A1 * | 9/2004 | Morgan et al. ................ 438/27 |
| 2005/0032264 A1 | 2/2005 | O'Gorman |
| 2005/0041709 A1 | 2/2005 | Anikitchev et al. |
| 2006/0186420 A1 * | 8/2006 | Hirukawa et al. ............... 257/82 |
| 2009/0213887 A1 | 8/2009 | Patchell |
| 2011/0051766 A1 | 3/2011 | Reill et al. |
| 2011/0243169 A1 | 10/2011 | Lauer et al. |

FOREIGN PATENT DOCUMENTS

| | | |
|---|---|---|
| DE | 10 2008 058 436 A1 | 5/2010 |
| JP | 58-34987 | 3/1983 |
| JP | 1-100985 | 4/1989 |
| JP | 1-132189 | 5/1989 |
| JP | 5-190976 | 7/1993 |
| JP | 2003-152280 | 5/2003 |
| JP | 2003-332690 | 11/2003 |
| JP | 2006-128295 | 5/2006 |
| JP | 2007-150170 | 6/2007 |
| JP | 2008-182177 | 8/2008 |
| JP | 2009-21454 | 1/2009 |
| WO | 01/97349 A1 | 12/2001 |
| WO | 2009/143813 A1 | 12/2009 |

OTHER PUBLICATIONS

P. Gavrilovic et al., "CW High Power Single-Lobed Far-Field Operation of Long-Cavity AlGaAs—GaAs Single-Quantum-Well Laser Diodes Grown by MOCVD," IEEE Journal of Quantum Electronics, vol. 27, No. 7, Jul. 1991, pp. 1859-1862.

Michael L. Tilton et al., "High Power, Nearly Diffraction-Limited Output from a Semiconductor Laser with an Unstable Resonator," IEEE Journal of Quantum Electronics, vol. 27, No. 9, Sep. 1991, pp. 2098-2108.

Swaminathan T. Srinivasan et al., "Semiconductor laser with unstable resonator consisting of negative cylindrical lenses," Proceedings of the SPIE—The International Society for Optical Engineering USA, vol. 1634, 1992, pp. 413-419.

E.S. Kintzer et al., "High-Power, Strained-Layer Amplifiers and Lasers with Tapered Gain Regions," IEEE Photonics Technology Letters, vol. 5, No. 6, Jun. 1993, pp. 605-608.

Yan Sun et al., "Thermally Controlled Lateral Beam Shift and Beam Steering in Semiconductor Lasers," IEEE Photonics Technology Letters, vol. 7, No. 1, 1995, pp. 26-28.

G.A. Vawter et al., Semiconductor Laser with Tapered-Rib Adiabatic-Following Fiber Coupler for Expanded Output-Mode Diameter, IEEE Photonics Technology Letters, vol. 9, No. 4, Apr. 1997, pp. 425-427.

P.M.W. Skovgaard et al., "Inhomogeneous pumping and increased filamentation threshold of semiconductor lasers by contact profiling," Electronics Letters, vol. 34, No. 20, Oct. 1, 1998, pp. 1950-1951.

Yoshiaki Watanabe et al., "Laterally Coupled Strained MQW Ridge Waveguide Distributed-Feedback Laser Diode Fabricated by Wet-Dry Hybrid Etching Process," IEEE Photonics Technology Letters, vol. 10, No. 12, Dec. 1998, pp. 1688-1690.

P. Salet et al., 1.1-W Continuous-Wave 1480-nm Semiconductor Lasers with Distributed Electrodes for Mode Shaping, IEEE Photonics Technology Letters, vol. 10, No. 12, Dec. 1998, pp. 1706-1708.

S.R. Šelmić et al., "Single Frequency 1550-nm AlGaInAs—InP Tapered High-Power Laser With a Distributed Bragg Reflector," IEEE Photonics Technology Letters, vol. 14, No. 7, Jul. 2002, pp. 890-892.

Bo Baoxue et al., "Rhombus-Like Stripe Ba InGaAs—AlGaAs—GaAs Lasers," IEEE Photonics Technology Letters, vol. 16, No. 5, May 2004, pp. 1248-1249.

Alexander Büttner et al., "Design considerations for high-brightness diffractive broad-area lasers," J. Opt. Soc. Am. B, vol. 22, No. 4, Apr. 2005, pp. 796-806.

Matthias Haag et al., "Novel high-brightness fiber coupled diode laser device," Proc. of SPIE, vol. 6456, 2007, 64560T-1-8.

Paul O. Leisher et al., "Stabilization of Lateral Mode Transients in High-Power Broad Area Semiconductor Lasers," Lasers and Electro-Optics Society (LEOS 2007), The 20th Annual Meeting of the IEEE, P1, Oct. 1, 2007, pp. 307-308.

Hans-Christoph Eckstein et al., "Control of slow axis mode behavior with waveguide phase structures in semiconductor broad-area lasers," Proc. of SPIE, vol. 7230, Feb. 3, 2009, pp. 72301O-1-72301L-7.

English translation of the Decision of Rejection of JP Application No. 2012-535694 dated Jan. 6, 2015.

* cited by examiner

EDGE EMITTING SEMICONDUCTOR LASER

RELATED APPLICATIONS

This patent application is a §371 of International Application No. PCT/EP2010/062416, with an international filing date of Aug. 25, 2010 (WO 2011/051013, published May 5, 2011), which claims priority of German Patent Application Nos. 10 2009 051 348.5, filed Oct. 30, 2009, and 10 2009 056 387.3, filed Nov. 30, 2009, the subject matter of which is hereby incorporated by reference.

TECHNICAL FIELD

This disclosure relates to an edge emitting semiconductor laser comprising a phase structure region for the selection of lateral laser modes.

BACKGROUND

Edge emitting semiconductors lasers for high output power are usually embodied as broad stripe lasers in which the active region can have a width of, for example, 100 μm or more. Owing to the comparatively large lateral extent of the active region, in general a large number of lateral laser modes can commence oscillation in the case of semiconductor lasers of this type. Multimode operation of an edge emitting semiconductor laser makes it more difficult, in particular, to couple the emitted laser light into downstream optical elements, for example, into optical waveguides.

To suppress higher lateral laser modes, in particular to obtain operation in the lateral fundamental mode, WO 01/97349 A1 discloses forming phase structures in the waveguide of an edge emitting semiconductor laser. The phase structures are regions of the semiconductor body in which the effective refractive index deviates from the effective refractive index of the regions of the semiconductor body that adjoin in a lateral direction, and which are embodied such that higher laser modes incur greater circulation losses in the laser resonator than the lateral fundamental mode of the semiconductor laser. The phase structures can be produced in the edge emitting semiconductor laser, for example, by structures being etched into the semiconductor body from the surface of the semiconductor body, which structures extend into the second cladding layer or even into the waveguide region. The structures can be optimized, for example, by simulations such that they produce lower losses for the lateral fundamental mode than for the higher laser modes such that the oscillation build-up of the laser in the lateral fundamental mode is promoted.

The phase structures known per se for semiconductor lasers that emit in the visible spectral range cannot readily be transferred to semiconductor lasers that emit in the infrared spectral range. This is due to the fact that the laser radiation in the case of semiconductor lasers in the infrared spectral range is concentrated onto the waveguide region to a greater extent and penetrates into the cladding layers to a lesser extent than the laser radiation in the case of semiconductor lasers in the visible spectral range. Moreover, the cladding layers in the case of semiconductor lasers in the infrared spectral range are comparatively thick on account of the comparatively high wavelength. For this reason, the effect of phase structures having small etching depths in the second cladding layer is only very small. On the other hand, a great dependence of the effect of phase structures on the etching depth is manifested if etching is effected into the vicinity of the waveguide region. To realize phase structures for semiconductor lasers in the infrared spectral range, therefore, it would be necessary to produce comparatively deep etching structures in the semiconductor body, the depths of which are very precisely defined. However, both requirements can be simultaneously fulfilled only with difficulty.

It could therefore be helpful to provide an edge emitting semiconductor laser comprising a semiconductor layer sequence that simplifies the production of phase structures such that phase structures can, in particular, also be realized for semiconductor lasers in the infrared spectral range.

SUMMARY

We provide an edge emitting semiconductor laser including a semiconductor body including a waveguide region wherein the waveguide region includes a first waveguide layer, a second waveguide layer and an active layer arranged between the first waveguide layer and the second waveguide layer and generates laser radiation, the waveguide region is arranged between a first cladding layer and a second cladding layer disposed downstream of the waveguide region in a growth direction of the semiconductor body, a phase structure for selection of lateral modes of the laser radiation emitted by the active layer is formed in the semiconductor body, wherein the phase structure includes at least one cutout extending from a top side of the semiconductor body, into the second cladding layer, at least one first intermediate layer including a semiconductor material different from the semiconductor material of the second cladding layer is embedded into the second cladding layer, and the cutout extends from a top side of the semiconductor body at least partly into the first intermediate layer.

We also provide an edge emitting semiconductor laser including a semiconductor body including a waveguide region wherein the waveguide region includes a first waveguide layer, a second waveguide layer and an active layer arranged between the first waveguide layer and the second waveguide layer and generates laser radiation, the waveguide region is arranged between a first cladding layer and a second cladding layer disposed downstream of the waveguide region in a growth direction of the semiconductor body, a phase structure for selection of lateral modes of the laser radiation emitted by the active layer is formed in the semiconductor body, wherein the phase structure includes at least one cutout extending from a top side of the semiconductor body into the second cladding layer, at least one first intermediate layer including a semiconductor material different from the semiconductor material of the second cladding layer is embedded into the second cladding layer, a second intermediate layer is embedded into the second cladding layer, the cutout extends from a top side of the semiconductor body into the first intermediate layer at at least one first point and extends into the second intermediate layer at at least one second point, and the cutout has a spatially varying depth between the first point and the second point.

We further provide an edge emitting semiconductor laser including a semiconductor body including a waveguide region wherein the waveguide region includes a first waveguide layer, a second waveguide layer and an active layer arranged between the first waveguide layer and the second waveguide layer and generates laser radiation, the waveguide region is arranged between a first cladding layer and a second cladding layer disposed downstream of the waveguide region in a growth direction of the semiconductor body, a phase structure for selection of lateral modes of the laser radiation emitted by the active layer is formed in the semiconductor body, wherein the phase structure includes at least one cutout extending from a top side of the semiconductor body into the second cladding layer, at least one first intermediate layer including a semiconductor material different from the semiconductor material of the second cladding layer is embedded into the second cladding layer, the cutout extends from a top side of the semiconductor body at least partly into the first intermediate layer, the second cladding layer contains a first partial layer which adjoins the waveguide region, and a second partial layer which adjoins the first partial layer, wherein the first partial layer has a greater refractive index than the second partial layer, and the at least one intermediate layer is embedded into the first partial layer of the second cladding layer.

DETAILED DESCRIPTION

Figure 1A:
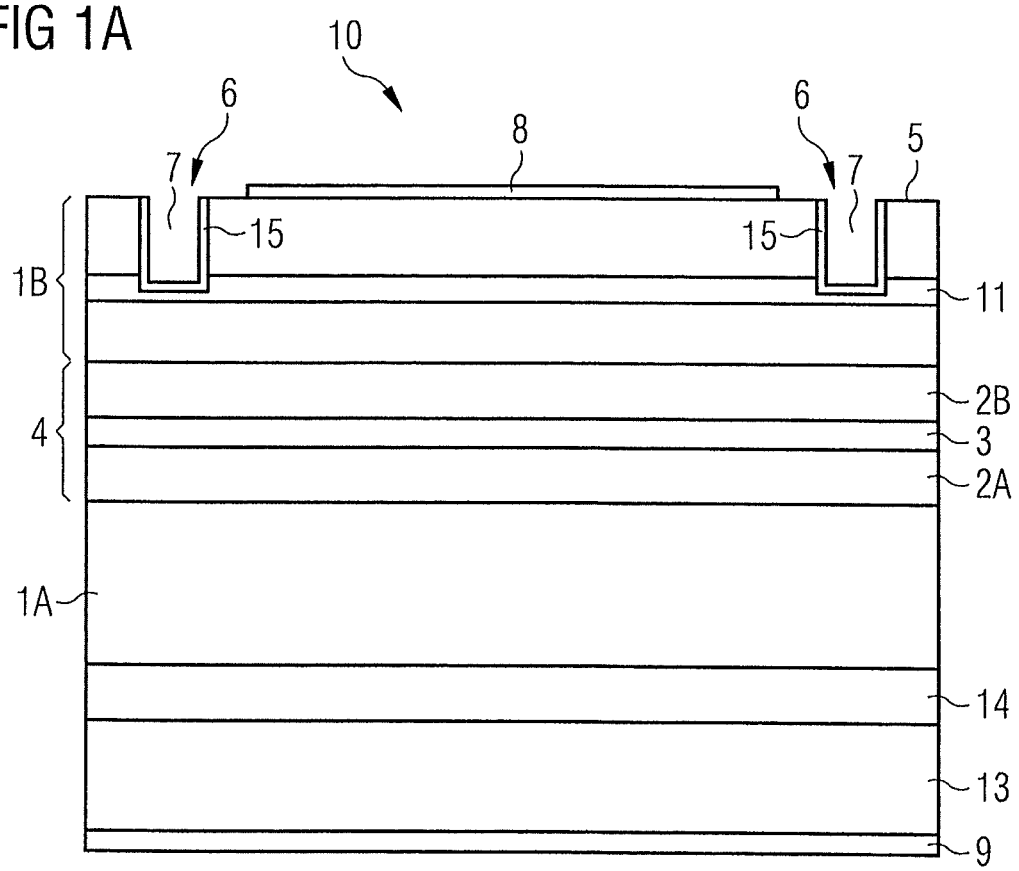
FIG. 1A shows a schematic illustration of a cross section through an example of an edge emitting semiconductor laser.

Our edge emitting semiconductor laser may contain a semiconductor body comprising a waveguide region, wherein the waveguide region comprises a first waveguide layer, a second waveguide layer and an active layer arranged between the first waveguide layer and the second waveguide layer and serving for generating laser radiation. In the active layer of the semiconductor body, electromagnetic radiation is generated and amplified during the operation of the semiconductor laser. By way of example, the active layer comprises one or a plurality of quantum wells, quantum wires or quantum dots.

The waveguide region is arranged between a first cladding layer and a second cladding layer disposed downstream of the waveguide region in the growth direction of the semiconductor body. The first and second cladding layers advantageously have a lower refractive index than the waveguide layers. On account of the difference in refractive index between the waveguide region and the cladding layers, the mode profile is concentrated greatly onto the waveguide region. Nevertheless, the laser modes at least slightly penetrate into the cladding layers.

A phase structure for the selection of lateral modes of the laser radiation emitted by the active layer is advantageously formed in the semiconductor body, wherein the phase structure comprises at least one cutout extending from a surface of the semiconductor body into the second cladding layer. The phase structure is preferably embodied such that the lateral fundamental mode of the laser radiation experiences lower losses than the radiation of higher laser modes. On account of the phase structure, the laser radiation that propagates in the waveguide region experiences circulation losses, wherein the structured region is embodied such that higher laser modes are damped to a greater extent than the lateral fundamental mode. What can be achieved in this way, in particular, is that only one or a few preferred laser modes, preferably only the lateral fundamental mode, commence oscillation during operation of the semiconductor laser.

By virtue of the fact that higher modes of the laser radiation are suppressed and preferably only the lateral fundamental mode commences oscillation, a high beam quality of the edge emitting semiconductor laser is obtained. In particular, the beam profile of the lateral fundamental mode is well suited to beam shaping with optical elements and, in particular, for highly efficient coupling into an optical fiber.

At least one intermediate layer composed of a semiconductor material different than the semiconductor material of the second cladding layer may be embedded into the second cladding layer. The at least one cutout which forms the phase structure extends from the top side of the semiconductor body at least partly into the intermediate layer.

The production of the phase structure by forming one or a plurality of cutouts in the semiconductor body can be effected in particular by an etching process in which the second cladding layer is partly removed. The etching process can be a wet-chemical etching process or a dry etching process. The intermediate layer embedded into the second cladding layer advantageously functions as an indicator layer for attaining a desired etching depth and facilitates targeted and reproducible production of cutouts having a defined depth. The intermediate layer embedded into the second cladding layer can be used as an etching stop layer during wet-chemical etching of the semiconductor body, in particular of the second cladding layer. In this case, a semiconductor material which, for the etching solution used, has a lower etching rate than the second cladding layer is used for the intermediate layer.

If a dry etching process such as plasma etching, for example, is used to produce the one or the plurality of cutouts in the semiconductor body, it is possible, by monitoring the optical emission of the plasma in the process chamber during the etching process, to deduce that the intermediate layer has been reached, and to stop the etching process at this location. To obtain a particularly homogeneous and defined etching depth, it is advantageous in this case if the intermediate layer has a lower etching rate than the second cladding layer during the plasma etching process.

Preferably, the semiconductor material of the intermediate layer is a III-V semiconductor material containing at least one element of the third or fifth main group of the periodic system which is not contained in the second cladding layer. The second cladding layer preferably contains a III-V semiconductor material such as, in particular, $Al_xGa_{1-x}As$ where $0 \leq x \leq 1$, preferably where $0 < x < 1$. Besides Al, Ga and As, the semiconductor material of the second cladding layer preferably does not contain any further main constituents, apart from one or a plurality of dopants or possible impurities. The intermediate layer preferably contains a semiconductor material containing In and/or P.

The semiconductor material of the at least one intermediate layer is preferably chosen such that it is lattice-matched to the surrounding semiconductor layers. Furthermore, it is advantageous if the band edge relevant to the conduction type of the intermediate layer, that is to say the valence band on the p-side of the active zone and the conduction band on the n-side, substantially corresponds to the surrounding second cladding layer.

Preferably, the intermediate layer has a thickness of 10 nm to 100 nm. Particularly preferably, the thickness of the intermediate layer is 20 nm to 50 nm. In the case of such a small thickness, the intermediate layer has only a small influence on the laser modes propagating in the semiconductor body. For the intermediate layer, therefore, it is advantageously also possible to use a semiconductor material whose refractive index does not necessarily have to be matched to the refractive index of the surrounding second cladding layer.

Further preferably, at least one further intermediate layer is embedded into the second cladding layer, wherein the cutout at least partly extends into the second intermediate layer. The second intermediate layer is arranged at a different depth than the first intermediate layer, as seen from the surface of the semiconductor body. The second intermediate layer advantageously functions as an indicator layer for attaining a second etching depth which is different than a first etching depth, for which the first intermediate layer functions as indicator layer. The second cladding layer is, therefore, preferably removed into the first intermediate layer at at least one point and removed into the second intermediate layer at at least one further point.

Preferably, the cutout extends into the first intermediate layer at at least one first point and into the second intermediate layer at at least one second point. In this case, the cutout has a spatially varying depth between the first point and the second point. The depth of the at least one cutout and the thickness of the second cladding layer can, for example, increase or decrease continuously, preferably linearly, between the first point and the second point. Alternatively, the depth of the cutout can also increase or decrease in stepped fashion in a plurality of steps. Abrupt changes in the refractive index between the phase structure and the main region of the semiconductor body are reduced as a result of the spatially varying depth of the cutout. In this way, coupling losses that can occur when the laser radiation crosses from the main region into the phase structure region of the semiconductor body are reduced, as a result of which the efficiency of the semiconductor laser is advantageously improved.

The second cladding layer may contain a first partial layer which adjoins the waveguide region and a second partial layer which adjoins the first partial layer, wherein the first partial layer has a greater refractive index than the second partial layer. In this case, the at least one intermediate layer embedded into the second cladding layer is not regarded as the first or second partial layer of the cladding layer. In the case of a second cladding layer composed of two partial layers, the at least one intermediate layer is, therefore, embedded into the first or into the second partial layer.

Preferably, the at least one intermediate layer is embedded into the first partial layer of the second cladding layer. The first partial layer of the second cladding layer has a refractive index lying between the refractive indices of the second waveguide layer and the second partial layer of the second cladding layer. The refractive index, therefore, decreases in stepped fashion apart from the at least one embedded intermediate layer from the second waveguide layer to the downstream first partial layer of the second cladding layer and to the second partial layer of the second cladding layer. What can be achieved is that the jump in refractive index from the second waveguide layer to the second cladding layer is less abrupt than if a second cladding layer having the refractive index of the second partial layer directly adjoined the second waveguide layer.

By virtue of the fact that the first partial layer of the second cladding layer has a refractive index lying between the refractive index of the second waveguide layer and the refractive index of the second partial layer of the second cladding layer, what is achieved is that a greater proportion of the laser radiation penetrates at least into the first partial layer of the second cladding layer than in the case of an abrupt change in refractive index from the refractive index of the second waveguide layer to the refractive index of the second partial layer of the second cladding layer. The effect of a phase structure on the lateral layer modes which have a comparatively large overlap with the second cladding layer is advantageously increased in this way. This facilitates, in particular, the use of phase structures in semiconductor lasers comprising comparatively thick second cladding layers, in particular, in semiconductor lasers that emit in the infrared spectral range.

It is also possible for the second cladding layer to comprise more than only two partial layers. In particular, the second cladding layer can comprise a plurality of partial layers whose refractive index decreases in stepped fashion in the growth direction of the semiconductor body from the second waveguide layer. Alternatively, the second cladding layer can also have a refractive index gradient, wherein the refractive index decreases continuously in the growth direction.

Furthermore, it is also possible for the first cladding layer arranged below the waveguide region in the growth direction of the semiconductor body also to be composed of two or more partial layers. By way of example, the first cladding layer can contain a first partial layer, which adjoins the first waveguide layer and has a lower refractive index than the first waveguide layer, and a second partial layer, which has a lower refractive index than the first partial layer. The refractive index, therefore, decreases in stepped fashion from the first waveguide layer toward the second partial layer of the first cladding layer.

The phase structure may be provided with a cover layer. The cutouts forming the phase structure are filled, for example, wholly or partly by the material of the cover layer. In particular, it is also possible for the cutouts of the phase structure to be completely planarized by the cover layer.

The cover layer can be, in particular, a passivation layer, which can contain, for example, a silicon oxide, a silicon nitride, a silicon oxynitride, an aluminum oxide, zinc selenide, germanium or benzocyclobutene (BCB). The cover layer preferably has a refractive index lower than the refractive index of the second cladding layer. By virtue of the fact that the cover layer has a refractive index between the refractive index of air and the refractive index of the semiconductor material of the second cladding layer, the jump in refractive index at the interfaces of the cutouts is reduced by comparison with cutouts filled only with air. Coupling losses at the interfaces of the cutouts are reduced in this way.

Alternatively, however, it is also possible for the phase structure to be provided with a cover layer having a greater refractive index than the semiconductor material. In this case, the cover layer can contain germanium, for example.

At least one contact strip may be applied to a surface of the semiconductor laser. The contact strip is preferably arranged at the top side of the semiconductor body. The contact strip can be an electrode via which electric current can be impressed into the semiconductor body. The electrode can be applied as a strip-shaped metallization, for example, to the top side of the semiconductor body. Furthermore, it is also possible for the contact strip to be defined by a strip-shaped perforation in a passivation layer on the top side of the semiconductor body. A metal layer can be applied to the passivation in large-area fashion. The metal layer is then in contact with the semiconductor body only in the region of the perforation.

Electromagnetic radiation is generated in the active layer of the semiconductor body by the impressed electric current. The edge emitting semiconductor laser is, therefore, an electrically pumped semiconductor laser.

The electromagnetic radiation is generated in the active zone below the contact strip. The emission region of the semiconductor laser is, therefore, situated there. If the semiconductor laser comprises a plurality of contact strips at the top side of the semiconductor body, then laser radiation is generated below each contact strip. The semiconductor laser then comprises a plurality of emission regions, the number of which corresponds to the number of contact strips on the top side. The at least one contact strip preferably extends along the main beam direction of the electromagnetic radiation generated in the active zone. The main extension direction of the contact strip is then parallel to the main beam direction of the emitter assigned to the contact strip. By way of example, the contact strip extends as a strip of uniform width along the main beam direction of the electromagnetic radiation generated in the semiconductor body.

The at least one contact strip of the edge emitting semiconductor laser advantageously has a width of 10 μm to 500 μm. In particular, the edge emitting semiconductor laser is, therefore, a so-called "broad stripe" laser.

Preferably, the edge emitting semiconductor laser comprises a plurality of contact strips at the surface. The plurality of contact strips are preferably arranged parallel to one another on the surface of the semiconductor body and are advantageously arranged at respectively identical distances with respect to one another. The edge emitting semiconductor laser is a so-called "laser bar" in this case.

Preferably, the contact strips of the semiconductor laser have a distance d and a width b, wherein the following holds true: $0.01 \leq b/d \leq 0.5$. In this case, the distance between the contact strips is, therefore, at least twice as large as the width of the contact strips. In the case of a semiconductor laser of this type, it is particularly advantageous to obtain, by the phase structure, operation in the lateral fundamental mode and a small beam divergence such that the emitted laser beams spaced apart from one another can be coupled into one or a plurality of optical fibers. By way of example, a laser system can comprise the edge emitting semiconductor laser described herein and at least one optical fiber, wherein the semiconductor laser emits one or a plurality of laser beams coupled into the optical fiber by one or a plurality of optical elements arranged between the semiconductor laser and the optical fiber.

The semiconductor laser can be, in particular, a semiconductor laser that emits in the infrared spectral range. Preferably, the semiconductor laser has an emission wavelength of 780 nm to 1500 nm.

Turning now to the Drawings, identical or identically acting component parts are provided with the same reference symbols. The illustrated component parts and the size relationships of the component parts among one another should not be regarded as true to scale.

Figure 1B:
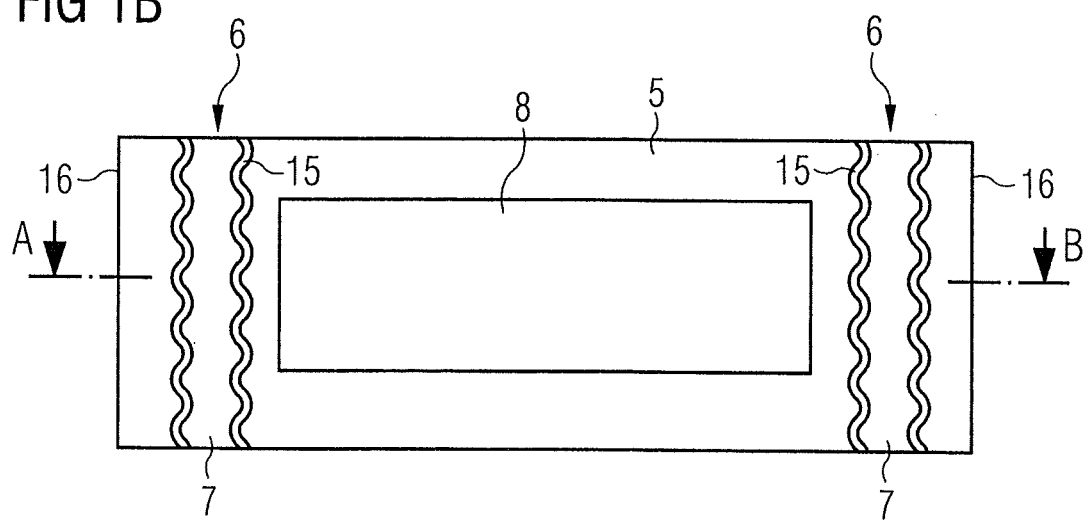
FIG. 1B shows a schematic illustration of a plan view of the exampled illustrated in FIG. 1A.

FIGS. 1A and 1B illustrate a first example of an edge emitting semiconductor laser. FIG. 1A shows a cross section along the line A-B from the plan view illustrated in FIG. 1B.

The edge emitting semiconductor laser comprises a semiconductor body 10 containing a waveguide region 4. The waveguide region 4 comprises a first waveguide layer 2A and a second waveguide layer 2B, between which an active layer 3 provided for generating laser radiation is arranged.

The active layer 3 of the edge emitting semiconductor laser can be, in particular, a single or multiple quantum well structure.

The waveguide layers 2A, 2B with the active layer 3 embedded therebetween form the waveguide region 4. The waveguide region 4 is arranged between a first cladding layer 1A and a second cladding layer 1B disposed downstream of the waveguide region 4 in the growth direction of the semiconductor body 10. The first cladding layer 1A is arranged on a side facing a substrate 13 of the semiconductor body 10 and the second cladding layer 1B is arranged on a side of the semiconductor body 10 facing away from the substrate 13 as seen from the active layer 3.

One or a plurality of further layers, for example, a buffer layer 14 can be arranged between the substrate 13 of the semiconductor body 10 and the first cladding layer 1A. Electrical contact is made with the edge emitting semiconductor laser, for example, by a first electrical contact layer 8 at a top side 5 of the semiconductor body 10 and a second electrical contact layer 9 at a rear side of the substrate 13. One or a plurality of further semiconductor layers (not illustrated) can be arranged between the second cladding layer 1B and the first electrical contact layer 8.

The cladding layers 1A, 1B advantageously have a lower refractive index than the waveguide layers 2A, 2B, as a result of which the laser radiation propagating in a lateral direction is substantially guided in the waveguide region 4. Owing to the finite difference in refraction between the waveguide layers 2A, 2B and the cladding layers 1A, 1B, however, the laser modes also propagate at least partly into the cladding layers 1A, 1B. Therefore, it is possible to influence the laser modes propagating in the waveguide region 4 by a change in the properties of the cladding layers 1A, 1B.

The semiconductor body 10 comprises phase structures 6 formed in the second cladding layer 1B. The phase structure 6 comprises two cutouts 7 extending from the top side 5 of the semiconductor body 10 into the second cladding layer 1B. The phase structure 6 is situated in a region of the second cladding layer 1B cut out from the first contact layer 8. Alternatively, however, it would also be possible to arrange the phase structure 6 at least partly below the first contact layer 8.

With the phase structures 6, the propagation of the laser modes can be influenced in a targeted manner, in which case, in particular, what can be achieved is that higher lateral modes have greater circulation losses in the laser resonator arranged between the side facets of the semiconductor body than the lateral fundamental mode of the semiconductor laser. With a suitable phase structures 6, therefore, it is possible to achieve, in particular, operation of the semiconductor laser in one or a plurality of preferred modes, in particular only in the lateral fundamental mode. Furthermore, the phase structures 6 also make it possible to shape the beam profile of the lateral fundamental mode. In particular, what can be achieved is that the radiation of the lateral fundamental mode has a small beam divergence. This is particularly advantageous for applications in which the radiation emitted by the semiconductor laser is intended to be coupled into an optical fiber.

The calculation of the three-dimensional structure of the phase structures 6 such that a desired influencing of the lateral mode spectrum is achieved is known per se from WO 01/97349 A1, the subject matter of which is incorporated herein by reference. The phase structure 6 can be calculated in advance, with the inclusion of the parameters of the materials of the semiconductor layer sequence, the geometrical dimensions and the wavelength of the emitted radiation such that higher lateral laser modes experience greater circulation losses in the laser resonator formed by the side facets 16 than lower lateral modes, in particular, the lateral fundamental mode of the semiconductor laser. By way of example, the distance between the respective side facets 16 of the semiconductor laser and the cutouts 7 in the second cladding layer 1B, which form the phase structure 6, in the plane of the second cladding layer 1B, can assume a wavy profile, as illustrated in the plan view in FIG. 1B.

The cutouts 7 extending from the top side 5 of the semiconductor body into the second cladding layer 1B are advantageously formed by an etching process in the semiconductor body 10. In this case, it may be necessary to etch comparatively deep cutouts 7 into the semiconductor body 10 to obtain the desired influencing of the lateral mode profile. Particularly in the case of semiconductor lasers which emit in the infrared spectral range and which are distinguished by a great concentration of the laser modes onto the waveguide region 4 and/or a comparatively thick second cladding layer 1B, it may be necessary to etch the cutouts 7 into the semiconductor body 10 with a depth such that they reach into the vicinity of the waveguide region 4. In this case, the desired etching depth has to be achieved as accurately as possible and has to be readily reproducible.

To facilitate the accurate and reproducible production of the cutouts 7 in the second cladding layer 1B, an intermediate layer 11 is advantageously embedded into the second cladding layer 1B, the intermediate layer consisting of a semiconductor material different than the semiconductor material of the second cladding layer 1B. The intermediate layer 11 differs in terms of its chemical composition from the second cladding layer 1B and comprises, in particular, a material of the third or fifth main group of the periodic system which is not contained in the second cladding layer 1B. The second cladding layer 1B can be, in particular, a layer composed of $Al_xGa_{1-x}As$ where $0<x<1$. In this case, the intermediate layer 11 is advantageously formed from a III-V semiconductor material containing a different material of the third or fifth main group than Al, Ga or As. Preferably, the intermediate layer 11 comprises In or P. By way of example, the material of the intermediate layer 11 can contain InGaP, InGaAs or InGaAlP. In this case, the second cladding layer 1B preferably contains neither In nor P.

During the etching process, the intermediate layer 11 advantageously functions as an indicator layer to attain a desired etching depth. Therefore, during the growth of the second cladding layer 1B, the intermediate layer 11 is incorporated into the second cladding layer 1B at the depth to which the cutouts 7 of the phase structure 6 are intended to reach. The etching can be effected by a wet-chemical etching process or by a dry etching process, or a combination of a wet-chemical and a dry etching process can also be used. Particularly in the case of a wet-chemical etching process, the intermediate layer 11 can function as an etching stop layer, wherein an etching solution is used which has a greater etching rate for the material of the second cladding layer 1B than for the material of the intermediate layer 11. During a dry etching process, detection of an element in the intermediate layer 11 which is not contained in the second cladding layer advantageously serves as an indicator for attaining the desired etching depth. During the etching process, therefore, a measuring device is used which can detect the occurrence of a chemical element only contained in the intermediate layer 11. By way of example, during a plasma etching process, by the monitoring of the optical emission of the plasma in the process chamber during etching, the element can be detected and it can thus be ascertained that the intermediate layer 11 has been reached. Consequently, the etching process can be stopped in a targeted manner at this location.

The cutouts 7 extend at least into the intermediate layer 11. Preferably, the cutouts 7 end in the intermediate layer 11. However, it is also possible for the cutouts to extend slightly more deeply into the semiconductor body 10 than into the intermediate layer 11. This case can occur, in particular, when the intermediate layer 11 is comparatively thin and an at least slight time delay occurs between the detection of the characteristic element contained in the intermediate layer and stopping the etching process.

Preferably, a layer that is very thin in comparison with the second cladding layer 1B is used as the intermediate layer 11. The thickness of the intermediate layer 11 is preferably 10 nm to 100 nm, particularly preferably 20 nm to 50 nm. In contrast thereto, the second cladding layer 1B can have a thickness of, for example, 1 µm or more. On account of the small thickness of the intermediate layer 11, the propagation of the laser modes is influenced only slightly by the intermediate layer 11. Therefore, it is possible to use for the intermediate layer 11 a material which differs in terms of its refractive index from the material of the second cladding layer 1B.

The phase structure 6 can at least partly be provided with a cover layer 15. As illustrated in FIG. 1A, by way of example, the side flanks and the bottom area of the cutouts 7 can be covered by the cover layer 15. Alternatively, it is also possible for the cutouts 7 to be partly or completely filled by the cover layer 15. The cover layer 15 preferably comprises an electrically insulating material such as, for example, a silicon oxide, a silicon nitride, a silicon oxynitride or benzocyclobutene (BCB).

The first contact layer 8 of the semiconductor body 10 is preferably embodied as a contact strip. The contact strip 8 runs with its longitudinal direction perpendicular to the side facets 16 of the semiconductor laser and defines the region into which current for generating laser radiation is impressed into the semiconductor body 10. As illustrated in FIG. 1B, the phase structures 6 can be formed for example in an edge region in the vicinity of the side facets 16 of the semiconductor body 10, wherein the contact strip 8 is situated between the phase structures 6. However, it is also possible for the contact strip 8 to run over the phase structures 6. This can be the case, in particular, when the cutouts 7 are filled by a cover layer 15. Unlike in FIGS. 1A and 1B, the phase structures can also extend as far as the side facets 16 of the semiconductor laser.

The contact strip 8 can be a strip-shaped metallization on the top side 5 of the semiconductor body 10. Alternatively, however, it is also possible for the top side 5 of the semiconductor body to be provided with a passivation layer, wherein the passivation layer has an opening that defines the contact strip 8 (not illustrated). In this case, the passivation layer can be covered with a metallization such as a gold layer, for example, in large-area fashion, wherein the contact with the semiconductor body 10 is produced only in the region of the opening that defines the contact strip 8.

The contact strip 8 preferably has a width of 10 µm to 500 µm. In particular, the edge emitting semiconductor laser can, therefore, be a broad stripe laser.

Figure 2A:
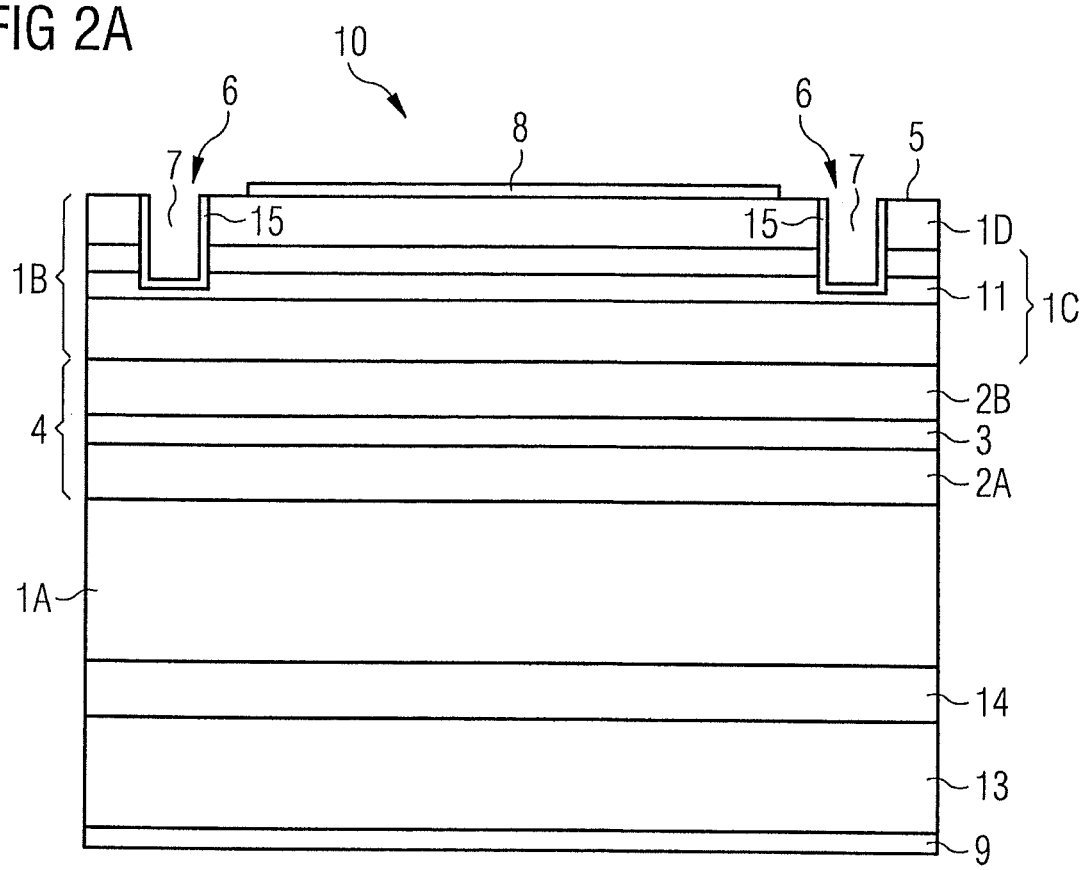
FIG. 2A shows a schematic illustration of a cross section through another example of an edge emitting semiconductor laser.
Figure 2B:
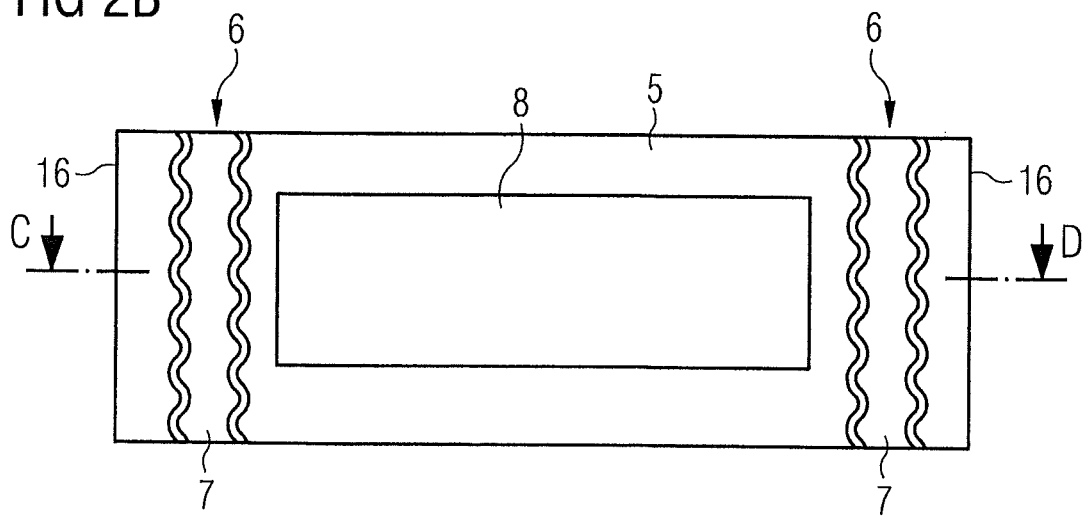
FIG. 2B shows a schematic illustration of a plan view of the example illustrated in FIG. 2A.

The second example of an edge emitting semiconductor laser as illustrated in a plan view in FIG. 2B and in a cross section along the line C-D from the plan view in FIG. 2A differs from the first example in that the second cladding layer 1B is composed of a first partial layer 1C and a second partial layer 1D. The first partial layer 1C adjoins the waveguide region 4 and the second partial layer 1D is arranged above the first partial layer 1C. In this example, the first partial layer 1C of the second cladding layer 1B has a greater refractive index than the second partial layer 1D. The refractive index of the second partial layer 1C therefore lies between the refractive index of the second waveguide layer 2B and of the second partial layer 1D.

By virtue of the fact that the first partial layer 1C of the second cladding layer 1B has a refractive index lying between the refractive index of the second waveguide layer 2A and the refractive index of the second partial layer 1D of the second cladding layer 1B, what is achieved is that a greater proportion of the laser radiation penetrates at least into the first partial layer 1C of the second cladding layer 1B than in the case of an abrupt change in the refractive index from the refractive index of the second waveguide layer 2A to the refractive index of the second partial layer 1D of the second cladding layer 1B. The effect of a phase structure on the lateral laser modes which have a comparatively large overlap with the second cladding layer 1B is advantageously increased in this way. This facilitates, in particular, the use of phase structures in semiconductor lasers comprising comparatively thick second cladding layers 1B, in particular, in semiconductor layers that emit in the infrared spectral range.

The intermediate layer 11, which, as in the case of the first example, serves for the defined setting of the depth of the cutouts 7 of the phase structures 6, is preferably arranged in the first partial layer 1C of the second cladding layer 1B. In this way, it is possible to produce cutouts 7 extending into the first partial layer 1C adjoining the waveguide region 4. Alternatively, however, it would also be conceivable to embed the intermediate layer 11 into the second partial layer 1D or to arrange it between the first partial layer 1C and the second partial layer 1D.

Otherwise, the second example corresponds to the first example with regard to its functioning and the advantageous configurations.

Figure 3A:
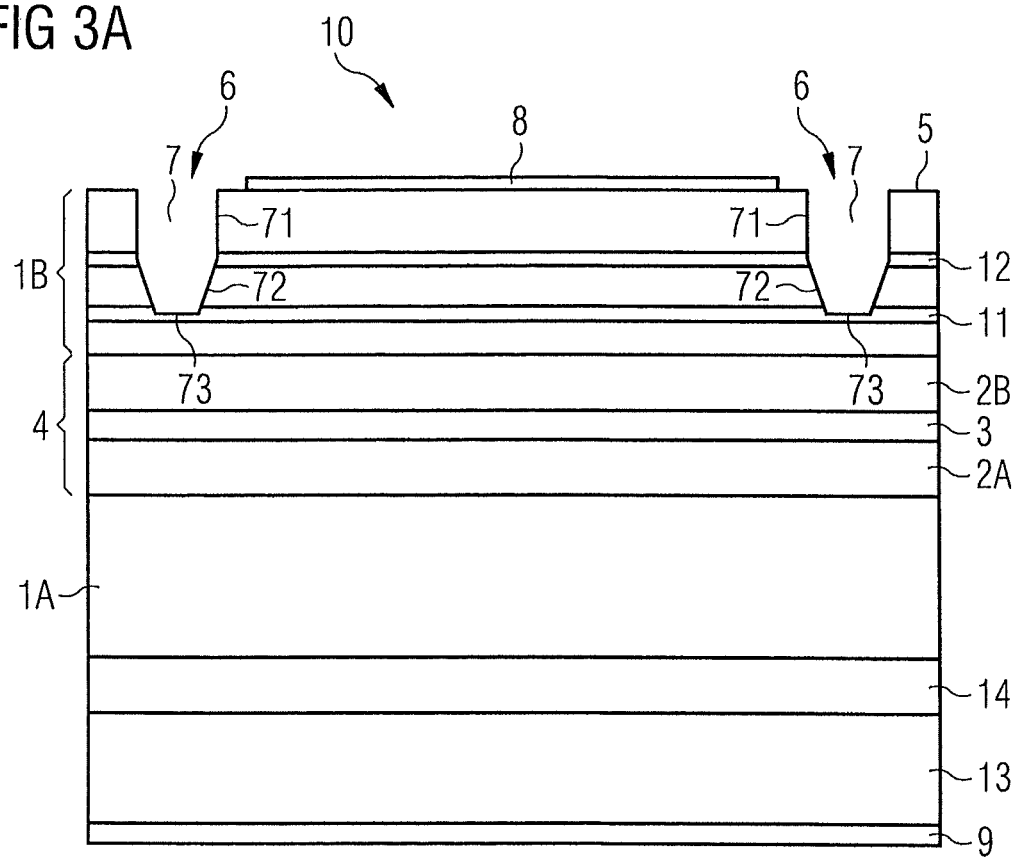
FIG. 3A shows a schematic illustration of a cross section through a further example of an edge emitting semiconductor laser.
Figure 3B:
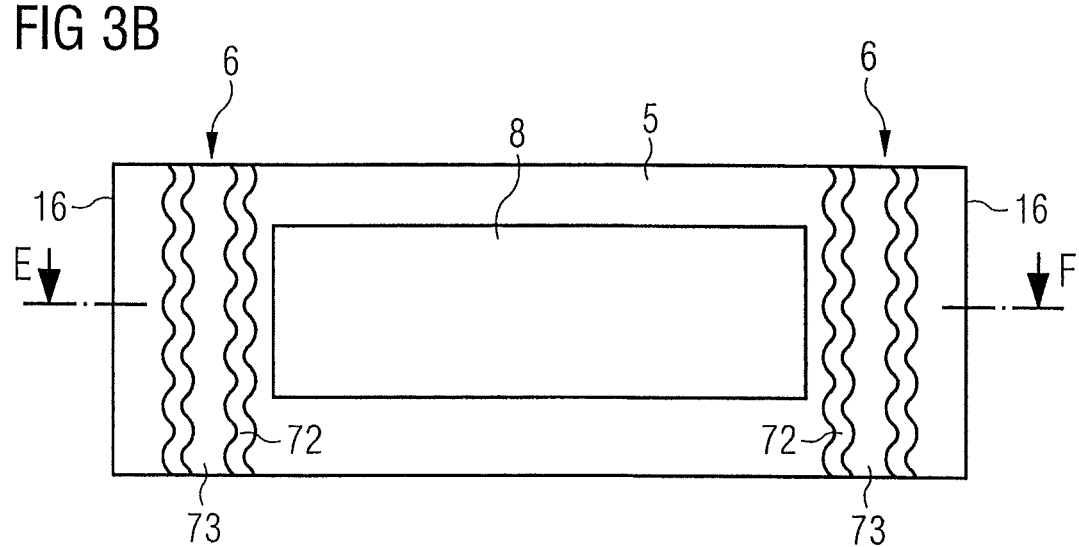
FIG. 3B shows a schematic illustration of a plan view of the example illustrated in FIG. 3A.

In the case of the third example of an edge emitting semiconductor laser as illustrated in a plan view in FIG. 3B and in a cross section along the line E-F from the plan view in FIG. 3A, in addition to the first intermediate layer 11, a second intermediate layer 12 is embedded into the second cladding layer 1B. The second intermediate layer 12 corresponds with regard to its functioning and advantageous configurations to the first intermediate layer 11 described in association with the first example. Like the first intermediate layer 11, the second intermediate layer 12 is also advantageously a layer which has a thickness of 10 nm to 100 nm, preferably 20 nm to 50 nm, and which consists of a semiconductor material different than the semiconductor material of the first cladding layer and comprises at least one element of the third or fifth main group not contained in the second cladding layer 1B.

Embedding the additional second intermediate layer 12 into the second cladding layer 1B facilitates production of phase structures 6 having a spatially varying depth in the second cladding layer 1B. In the example illustrated in cross section in FIG. 3A, the cutouts 7 extend into the second intermediate layer 12 at their side flanks 71 and into the first intermediate layer 11 at their base area 73. Between the side flanks 71 and the base area 73, the cutouts 7 have oblique side flanks 72. In the region of the oblique side flanks 72, the depth of the cutouts 7 varies continuously, in particular linearly.

Cutouts 7 of this type can be produced, for example, by a first etching process first applied until the second intermediate layer 12, which is arranged above the first intermediate layer 11 in the second cladding layer 1B, is reached, the first etching process producing steep and preferably perpendicular side flanks 71. Afterward, by a second etching process which produces oblique side flanks 72, etching is continued as far as the second intermediate layer 12. In particular, a wet-chemical etching process can be used as the first etching process and a dry etching process can be used as the second etching process. Alternatively, other variants are also conceivable, for example, two successive wet-chemical etching processes using different etching solutions or two successive dry etching processes.

In this way, it is advantageously possible to produce phase structures 6 in which the difference in refractive index between the phase structure 6 and the rest of the semiconductor body 10 is less abrupt than in the case of cutouts having a constant depth. Coupling losses that can occur when the laser radiation crosses from the main region into the phase structure 6 of the semiconductor body 10 are thereby reduced, as a result of which the efficiency of the semiconductor laser is advantageously improved.

Otherwise, the third example corresponds to the first example with regard to its functioning and the advantageous configurations.

Figure 4:
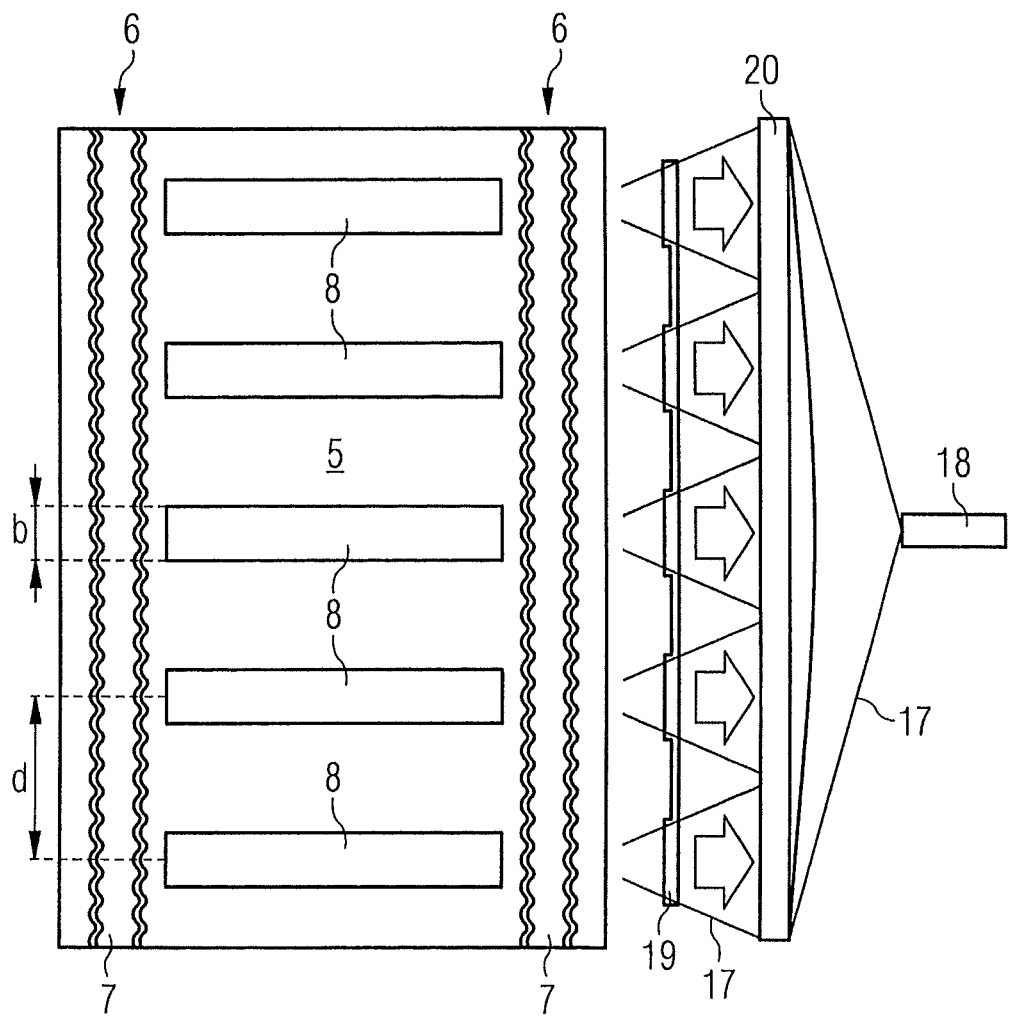
FIG. 4 shows a schematic illustration of a plan view of a still further example of an edge emitting semiconductor laser.

In the case of the example illustrated schematically in a plan view in FIG. 4, the edge emitting semiconductor laser is a laser bar comprising a plurality of contact strips 8 at the top side 5 of the semiconductor body 10. The contact strips 8 run parallel to one another and with their longitudinal direction perpendicular to the side facets 16 of the semiconductor laser. The contact strips 8 are arranged, for example, between the phase structures 6 and the side flanks 16 of the semiconductor body 10. The semiconductor body 10 and the phase structures 6 contained therein can be embodied as in the case of the examples described above, and will, therefore, not be explained in greater detail again.

By the plurality of contact strips 8, a respective current for electrically pumping the active layer of the semiconductor laser is conducted into the semiconductor body 10. The active layer of the laser bar, therefore, comprises a plurality of emission regions each arranged below the contact strips 8. In the example illustrated, the number of contact strips 8 and of emission regions is five.

The contact strips 8 preferably in each case have the same width b and the same distance d from one another. The width b of the contact strips 8 can be 10 μm to 500 μm, for example. For the distances d between the centers of the contact strips, the following preferably holds true: 0.01 b/d 0.5. If the contact strips have a width of 100 μm, for example, the distance d is at least 200 μm. A laser bar having such a ratio of the widths b to the distances d of the contact strips 8 is particularly well suited to coupling the plurality of emitted laser beams 17 into an optical fiber 18. The laser beams 17 can be coupled into the optical fiber 18 by one or a plurality of optical elements 19, 20. By way of example, the first optical element 19 can be a microlens array, wherein each emission region is assigned a microlens which brings about beam shaping of the respective laser beam 17. The plurality of beams can, for example, be concentrated by a further optical element, for example, a lens 20, and be coupled into the optical fiber 18.

For such an application in which the radiation from the semiconductor laser is coupled into an optical fiber 18, the semiconductor body 10 provided with the phase structures 6 is particularly well suited because a small beam divergence both in the vertical and in the horizontal beam direction can be obtained by the phase structures 6. Therefore, it is possible to use comparatively simple optical elements 19, 20 such as, for example, spherical lenses instead of complicated aspherical optical elements, or it is even possible to dispense with one or even all of the optical elements 19, 20.

Figure 5:
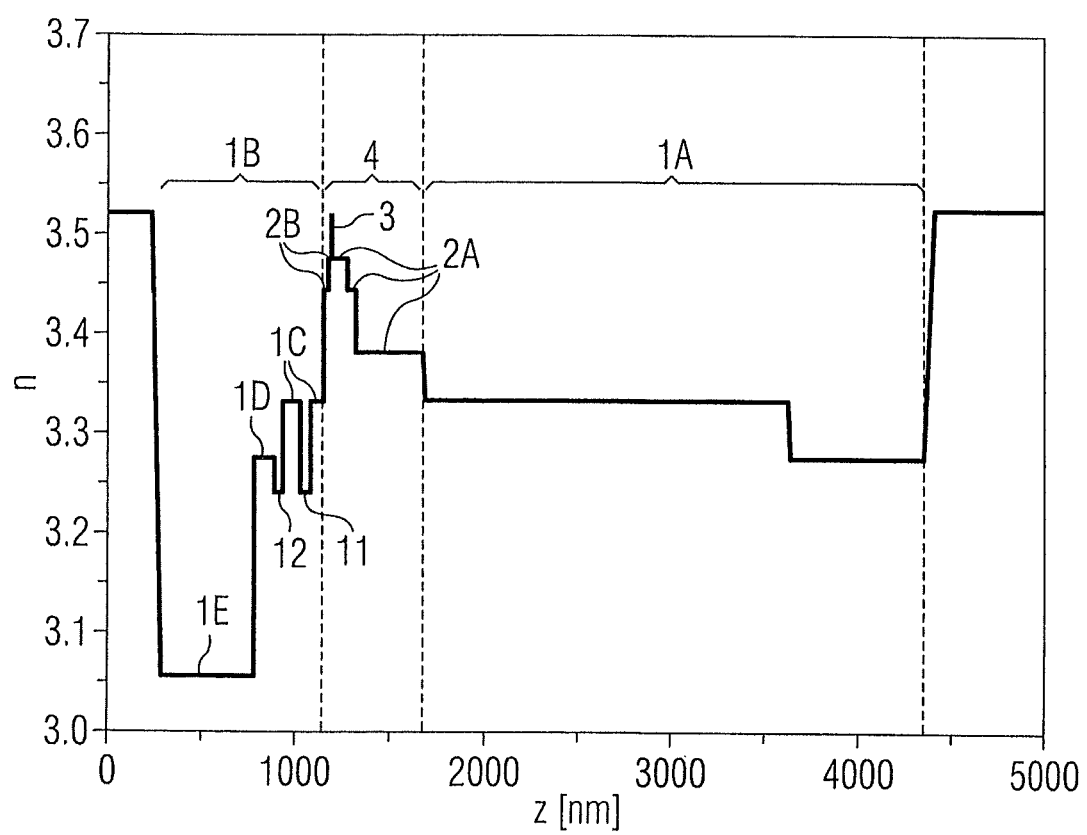
FIG. 5 shows a graphical illustration of the profile of the refractive index n in a vertical direction z in the semiconductor body in the case of a further example of an edge emitting semiconductor laser.

FIG. 5 schematically illustrates the profile of the refractive index n in a further example of an edge emitting semiconductor laser along a spatial coordinate z running from the top side of the semiconductor body in the direction of the substrate.

The edge emitting semiconductor laser comprises a first cladding layer 1A, a second cladding layer 1B and a waveguide region 4 arranged therebetween. The waveguide region 4 comprises an active layer 3, which is a quantum well layer, and also the first waveguide layer 2A and the second waveguide layer 2B.

As can be gathered from the stepped profile of the refractive index, the waveguide layers 2A, 2B and the cladding layers 1A, 1B are each composed of a plurality of partial layers. By way of example, the first cladding layer 1A comprises two partial layers, the first waveguide layer 2A comprises three partial layers and the second waveguide layer 2B comprises two partial layers. The second cladding layer 1B comprises three partial layers 1C, 1D, 1E. In the partial layers of the waveguide and cladding layers, the refractive index n increases in stepped fashion from the top side of the semiconductor body towards the active layer and decreases in stepped fashion from the active layer 3 in the direction of the substrate.

Two intermediate layers 11, 12 are embedded into the second cladding layer 1B, the intermediate layers consisting of a semiconductor material comprising at least one element of the third or fifth main group which is not contained in the partial layers 1C, 1D and 1E of the second cladding layer 1B. By way of example, the partial layers 1C, 1D, 1E of the second cladding layer 1B can comprise $Al_xGa_{1-x}As$ where $0<x<1$, wherein the intermediate layers 11, 12 contain an In- and/or P-containing semiconductor material such as, for example, InGaAs, InGaP or InGaAsP.

On account of the different chemical element contained in them, the intermediate layers 11, 12 are not regarded as partial layers of the second cladding layer 1B. By contrast, the partial layers 1C, 1D, 1E of the second cladding layer have the same constituents, which, however, can be present in different concentrations. Thus, the partial layers 1C, 1D, 1E of the second cladding layer 1B can comprise, for example, $Al_xGa_{1-x}As$ where $0<x<1$, wherein the partial layers have a different aluminum content x. In particular, the aluminium content can decrease from the top side of the second cladding layer 1B towards the active layer 3, such that the refractive index increases from partial layer to partial layer in this direction.

The first intermediate layer 11 is embedded into the first partial layer 1C of the second cladding layer 1B. The second intermediate layer 12 is arranged between the first partial layer 1C and the second partial layer 1D. The two intermediate layers 11, 12 embedded into the second cladding layer 1B simplify the production of phase structures comprising cutouts having a variable depth, as described above in association with FIGS. 3A and 3B.

For the use of phase structures in edge emitting semiconductor lasers, in particular, in infrared semiconductor lasers, it has furthermore proved to be advantageous for the second waveguide layer 2B to be made thinner than the first waveguide layer 2A. Preferably, the second waveguide layer 2B has only half the thickness, particularly preferably only one fifth or even only one tenth of the thickness of the first waveguide layer 2A.

This disclosure is not restricted by the description on the basis of the examples. Rather, the disclosure encompasses any novel feature and also any combination of features, which in particular includes any combination of features in the appended claims, even if the feature or combination itself is not explicitly specified in the claims or examples.

The invention claimed is:

1. An edge emitting semiconductor laser comprising:
 a semiconductor body comprising a waveguide region wherein
 the waveguide region comprises a first waveguide layer, a second waveguide layer and an active layer arranged between the first waveguide layer and the second waveguide layer and generates laser radiation,
 the waveguide region is arranged between a first cladding layer and a second cladding layer disposed downstream of the waveguide region in a growth direction of the semiconductor body,
 a phase structure for selection of lateral modes of the laser radiation emitted by the active layer is formed in the semiconductor body, wherein the phase structure comprises at least one cutout extending from a top side of the semiconductor body into the second cladding layer;
 side facets forming a laser resonator, wherein the laser radiation crosses from a main region to the phase structure region of the semiconductor body when propagating between the side facets;
 at least one first intermediate layer comprising a semiconductor material different from the semiconductor material of the second cladding layer embedded into the second cladding layer; and
 a second intermediate layer embedded into the second cladding layer,
 the cutout extending from a top side of the semiconductor body into the first intermediate layer at at least one first point and extending into the second intermediate layer at at least one second point, and
 the cutout has a spatially varying depth between the first point and the second point and the depth of the cutout in the second cladding layer increases or decreases between the first point and the second point continuously or in stepped fashion in a plurality of steps in a direction parallel to the direction of the laser radiation propagating between the side facets, thereby reducing coupling losses when the laser radiation crosses from the main region to the phase structure region.

2. The edge emitting semiconductor laser according to claim 1, wherein the semiconductor material of the intermediate layer contains at least one element of main group III or V which is not contained in the second cladding layer.

3. The edge emitting semiconductor laser according to claim 1, wherein the second cladding layer comprises $Al_xGa_{1-x}As$ where $0 \leq x \leq 1$ and the intermediate layer contains In and/or P.

4. The edge emitting semiconductor laser according to claim 1, wherein the intermediate layer has a thickness of 10 nm to 100 nm.

5. The edge emitting semiconductor laser according to claim 1, wherein a second intermediate layer is embedded into the second cladding layer and the cutout extends at least partly into the second intermediate layer.

6. The edge emitting semiconductor laser according to claim 5, wherein the cutout extends into the first intermediate layer at least one first point and extends into the second intermediate layer at at least one second point, wherein the cutout has a spatially varying depth between the first point and the second point.

7. The edge emitting semiconductor laser according to claim 1, wherein the second cladding layer contains a first partial layer which adjoins the waveguide region, and a second partial layer which adjoins the first partial layer, wherein the first partial layer has a greater refractive index than the second partial layer.

8. The edge emitting semiconductor laser according to claim 7, wherein the at least one intermediate layer is embedded into the first partial layer of the second cladding layer.

9. The edge emitting semiconductor laser according to claim 1, wherein the phase structure is at least partly provided with a cover layer.

10. The edge emitting semiconductor laser according to claim 9, wherein the cover layer comprises a silicon oxide, a silicon nitride, a silicon oxynitride, an aluminum oxide, zinc selenide, germanium or benzocyclobutene.

11. The edge emitting semiconductor laser according to claim 1, wherein at least one contact strip is applied to the semiconductor body.

12. The edge emitting semiconductor laser according to claim 11, wherein the contact strip has a width b of 10 μm to 500 μm.

13. The edge emitting semiconductor laser according to claim 11, wherein the edge emitting semiconductor laser comprises a plurality of contact strips.

14. The edge emitting semiconductor laser according to claim 13, wherein the contact strips have a distance d and a width b, and wherein $0.01 \leq b/d \leq 0.5$.

15. The edge emitting semiconductor laser according to claim 1, wherein the semiconductor laser emits laser radiation in an infrared spectral range having a wavelength of 780 nm to 1500 nm during operation.

\* \* \* \* \*